United States Patent
Zhang et al.

(10) Patent No.: US 11,949,011 B2
(45) Date of Patent: Apr. 2, 2024

(54) VERTICAL TRANSISTOR WITH GATE ENCAPSULATION LAYERS

(71) Applicant: INTERNATIONAL BUSINESS MACHINES CORPORATION, Armonk, NY (US)

(72) Inventors: Chen Zhang, Guilderland, NY (US); ChoongHyun Lee, Chigasaki (JP)

(73) Assignee: International Business Machines Corporation, Armonk, NY (US)

(*) Notice: Subject to any disclaimer, the term of this patent is extended or adjusted under 35 U.S.C. 154(b) by 227 days.

(21) Appl. No.: 17/456,894

(22) Filed: Nov. 30, 2021

(65) Prior Publication Data
US 2023/0170415 A1   Jun. 1, 2023

(51) Int. Cl.
   *H01L 29/78*   (2006.01)
   *H01L 29/10*   (2006.01)
   *H01L 29/66*   (2006.01)

(52) U.S. Cl.
   CPC ...... *H01L 29/7827* (2013.01); *H01L 29/1033* (2013.01); *H01L 29/66666* (2013.01)

(58) Field of Classification Search
   CPC ............. H01L 29/7827; H01L 29/1033; H01L 29/66666; H01L 21/32105; H01L 29/0847; H01L 29/4966
   USPC ........................................................ 257/335
   See application file for complete search history.

(56) References Cited

U.S. PATENT DOCUMENTS

| | | | |
|---|---|---|---|
| 6,770,534 B2 | 8/2004 | Cho | |
| 7,683,428 B2 | 3/2010 | Chidambarrao | |
| 9,773,708 B1 | 9/2017 | Zhang | |
| 9,966,456 B1* | 5/2018 | Park | H01L 21/823487 |
| 10,002,962 B2 | 6/2018 | Anderson | |
| 10,229,986 B1 | 3/2019 | Jagannathan | |
| 10,559,676 B2 | 2/2020 | Ando | |
| 2006/0261406 A1 | 11/2006 | Chen | |
| 2019/0051563 A1 | 2/2019 | Park | |
| 2019/0198400 A1* | 6/2019 | Miao | H01L 29/7827 |
| 2019/0198641 A1* | 6/2019 | Zhang | H01L 29/78684 |
| 2020/0066604 A1 | 2/2020 | Mochizuki | |

OTHER PUBLICATIONS

Cartier et al., "pFET Vt control with HfO2/TiN/poly-Si gate stack using a lateral oxygenation process", 2009 Symposium on VLSI Technology Digest of Technical Papers, pp. 42-43.

* cited by examiner

*Primary Examiner* — Mohammad M Hoque
(74) *Attorney, Agent, or Firm* — L. Jeffrey Kelly

(57) ABSTRACT

A semiconductor structure including a bottom source drain region arranged on a substrate, a semiconductor channel region extending vertically upwards from a top surface of the bottom source drain region, a metal gate disposed around the semiconductor channel region, a top source drain region above the semiconductor channel region, an amorphous silicon layer directly on top of the metal gate, and an oxidation layer directly on top of the amorphous silicon layer, where the amorphous silicon layer and the oxidation layer together completely separate the metal gate from a surrounding interlevel dielectric layer.

20 Claims, 15 Drawing Sheets

VERTICAL TRANSISTOR WITH GATE ENCAPSULATION LAYERS

BACKGROUND

The present invention generally relates to semiconductor structures, and more particularly to a vertical transistor having a silicon nitride free gate encapsulation layer.

Vertical transistors are an attractive option for technology scaling for 5 nm and beyond technologies. Vertical transistors have a channel oriented perpendicular to the substrate surface, as opposed to being situated along the plane of the surface of the substrate in the case of a lateral transistor. By using a vertical design, it is possible to increase packing density. That is, by having the channel perpendicular to the substrate, vertical transistors improve the scaling limit beyond lateral transistors.

SUMMARY

According to one embodiment of the present invention, a semiconductor structure is provided. The semiconductor structure may include a bottom source drain region arranged on a substrate, a semiconductor channel region extending vertically upwards from a top surface of the bottom source drain region, a metal gate disposed around the semiconductor channel region, a top source drain region above the semiconductor channel region, an amorphous silicon layer directly on top of the metal gate, and an oxidation layer directly on top of the amorphous silicon layer, wherein the amorphous silicon layer and the oxidation layer together completely separate the metal gate from a surrounding interlevel dielectric layer.

According to one embodiment of the present invention, a semiconductor structure is provided. The semiconductor structure may include a bottom source drain region arranged on a substrate, a semiconductor channel region extending vertically upwards from a top surface of the bottom source drain region, a metal gate disposed around the semiconductor channel region, a top source drain region above the semiconductor channel region, an amorphous silicon layer directly on top of the metal gate, an oxidation layer directly on top of the amorphous silicon layer, wherein the amorphous silicon layer and the oxidation layer together completely separate the metal gate from a surrounding interlevel dielectric layer, and wherein an uppermost surface of the metal gate, an uppermost surface of the amorphous silicon layer, and an upper surface of the oxidation layer are substantially flush with one another, and an upper surface of the oxidation layer is substantially flush with an uppermost surface of the top source drain region.

According to another embodiment, a method is provided. The method may include forming a bottom source drain region arranged on a substrate, forming a semiconductor channel region extending vertically upwards from a top surface of the bottom source drain region, forming a metal gate disposed around the semiconductor channel region, forming a top source drain region above the semiconductor channel region, forming an amorphous silicon layer directly on top of the metal gate, and forming an oxidation layer directly on top of the amorphous silicon layer, wherein the amorphous silicon layer and the oxidation layer together completely separate the metal gate from a surrounding interlevel dielectric layer.

BRIEF DESCRIPTION OF THE DRAWINGS

The following detailed description, given by way of example and not intended to limit the invention solely thereto, will best be appreciated in conjunction with the accompanying drawings, in which.

Figure 1:
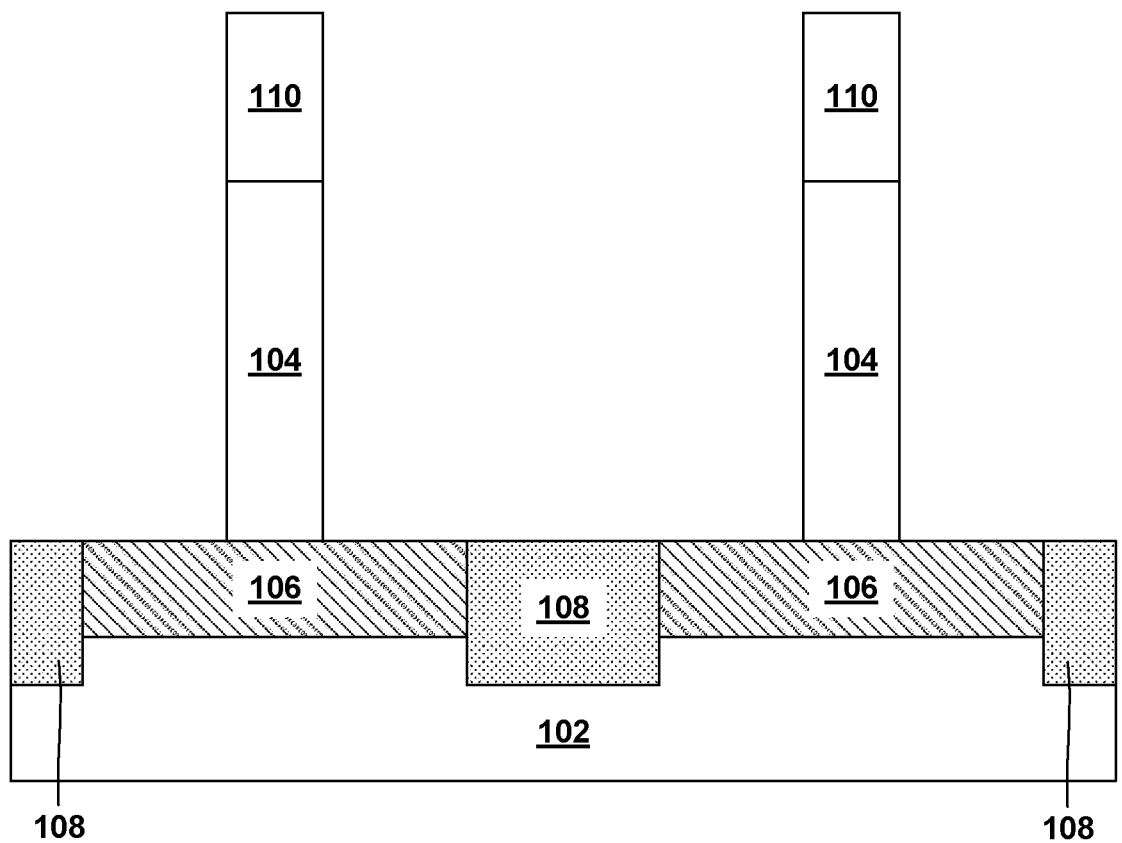
FIG. 1 is a cross-sectional view of a semiconductor structure during an intermediate step of a method of fabricating a vertical transistor with a SiN free gate encapsulation layer according to an exemplary embodiment.

The drawings are not necessarily to scale. The drawings are merely schematic representations, not intended to portray specific parameters of the invention. For clarity and ease of illustration, scale of elements may be exaggerated. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Also, the term "sub-lithographic" may refer to a dimension or size less than current dimensions achievable by photolithographic processes, and the term "lithographic" may refer to a dimension or size equal to or greater than current dimensions achievable by photolithographic processes. The sub-lithographic and lithographic dimensions may be determined by a person of ordinary skill in the art at the time the application is filed.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Vertical transport FETs (VTFET) have known advantages over conventional FinFETs in terms of density, performance, power consumption, and integration. Current process of record includes depositing a silicon nitride encapsulation layer directly on the metal gate, otherwise work function metal; however, doing so, detrimentally affects the threshold voltage, especially in structures fabricated with relatively thin metal gates.

Oxygen diffuses through typical silicon nitride encapsulation layers on WFM/HK/IL and causes the severe IL growth, Vt shift, and gate stack reliability issues. Direct deposition of silicon nitride on the metal gate also modifies the metal gate properties. Therefore, there is a need for an oxygen-free gate encapsulation layer that is compatible with advanced high-k metal gate stacks.

The present invention generally relates to semiconductor structures, and more particularly to a vertical transistor having a silicon nitride free gate encapsulation layer. More specifically, the vertical transistor structure disclosed herein minimize unwanted shifts in threshold voltage and increase device reliability by applying different encapsulation materials. Exemplary embodiments of a vertical transistor having a silicon nitride free gate encapsulation layer described in detail below by referring to the accompanying drawings in FIGS. 1 to 15. Those skilled in the art will readily appreciate that the detailed description given herein with respect to these figures is for explanatory purposes as the invention extends beyond these limited embodiments.

Referring now to FIG. 1, a structure 100 is shown during an intermediate step of a method of fabricating a vertical transistor with a SiN free gate encapsulation layer according to an embodiment of the invention. The structure 100 illustrated in FIG. 1 includes a semiconductor substrate 102 (hereinafter "substrate"), semiconductor fins 104, bottom source drain regions 106, and shallow trench isolation regions 108 (hereinafter "STI regions") formed thereon.

The substrate 102 is shown and may be formed from any appropriate material including, e.g., bulk semiconductor or a semiconductor-on-insulator layered structure. Illustrative examples of suitable materials for the substrate 102 include, but are not limited to, silicon, silicon germanium, carbon dope silicon germanium, carbon doped silicon, polysilicon, epitaxial silicon, amorphous silicon, and multi-layers thereof. Although silicon is the predominantly used semiconductor material in wafer fabrication, alternative semiconductor materials can be employed, such as, but not limited to, gallium arsenide, indium phosphide, indium gallium arsenide, indium arsenide, gallium, cadmium telluride and zinc sellenide.

In the present embodiment, the substrate 102 is a bulk semiconductor substrate. By "bulk" it is meant that the semiconductor substrate 102 is entirely composed of at least one of the above materials listed above. In an embodiment, the substrate 102 can be entirely composed of silicon. In other embodiments, the semiconductor substrate 102 may include a multilayered semiconductor material stack including at least two different semiconductor materials, as defined above. In an embodiment, the multilayered semiconductor material stack may include, in any order, a stack of silicon and a silicon germanium alloy. In another embodiment, the semiconductor substrate 102 may include a single crystalline semiconductor material. Such single crystal materials may have any of the well-known crystal orientations. For example, the crystal orientation of the semiconductor substrate 102 may be {100}, {110}, or {111}. Other crystallographic orientations besides those specifically mentioned can also be used in the present application.

The semiconductor fins 104 are formed from a semiconductor layer (not shown), and form the channel of the vertical transistor device depicted by the structure 100. First, masks 110 are deposited on the semiconductor layer. The masks 110 define regions for the semiconductor fins 104.

The semiconductor layer is etched or patterned using an anisotropic etch such as, for example, reactive ion etching, to remove material that is not covered by the masks 110 to form the semiconductor fins 104. Although the present application describes and illustrates forming two semiconductor fins 104, the same process may be used to form a single semiconductor fin, or more than two semiconductor fins.

As used herein, a "semiconductor fin" refers to a semiconductor material that includes a pair of vertical sidewalls that are parallel to each other. As used herein, a surface is "vertical" if there exists a vertical plane from which the surface does not deviate by more than three times the root mean square roughness of the surface. In an embodiment, each semiconductor fin 104 has a height ranging from approximately 20 nm to approximately 200 nm, and a width ranging from approximately 5 nm to approximately 30 nm. Other heights and/or widths that are lesser than, or greater than, the ranges mentioned herein can also be used in the present application. Each semiconductor fin 104 is spaced apart from its nearest neighboring semiconductor fin 104 by a pitch ranging from approximately 20 nm to approximately 100 nm; the pitch is measured from one point, or reference surface, of one semiconductor fin to the exact same point, or reference surface, on a neighboring semiconductor fin. Also, the semiconductor fins 104 are generally oriented parallel to each other. Each semiconductor fin 104 extends upward from a top surface of the bottom source drain regions 106.

In general, the bottom source drain regions 106 are arranged on the substrate 102. Specifically, in the illustrated embodiment, the bottom source drain regions 106 are epitaxially grown within trenches or recesses formed in the substrate 102. In other embodiments, the bottom source drain regions 106 are epitaxially grown directly on top of the substrate 102 adjacent to the semiconductor fins 104 and subsequently patterned, if needed. In yet another embodiment, the bottom source drain regions 106 are formed by doping an exposed surface of the substrate 102 using an ion implant technique.

It should be understood that the bottom source drain regions 106 may be either one of a source region or a drain region, as appropriate. Illustrative examples of suitable materials for the bottom source drain regions 106 include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, silicon germanium, cadmium telluride and zinc sellenide.

The bottom source drain regions 106 may be doped with dopant atoms. The bottom source drain regions 106 may be in-situ doped as they are grown or deposited on the substrate 102 or, alternatively, may be subsequently doped using an implantation technique. The dopant atoms may be an n-type dopant or a p-type dopant. Exemplary n-type dopants include phosphorus, arsenic antimony, selenium, tellurium, silicon, and germanium. Exemplary p-type dopants include beryllium, zinc, cadmium, silicon, germanium, boron, aluminum, and gallium. In an embodiment, the bottom source drain regions 106 are made from doped Si:C(P) (for n-type devices) or SiGe:B (for p-type devices), with dopant concentrations ranging from approximately $2 \times 10^{20}$ to approximately $2.5 \times 10^{21}$ atoms/cm2, with a dopant concentration ranging from approximately $4 \times 10^{20}$ to approximately $2 \times 10^{21}$ atoms/cm2 being more typical.

In another embodiment, the bottom source drain regions 106 may be formed from a III-V semiconductor. The term "III-V compound semiconductor" denotes a semiconductor material that includes at least one element from Group III of the Periodic Table of Elements and at least one element from Group V of the Periodic Table of Elements. Typically, the III-V compound semiconductors are binary, ternary or quaternary alloys including III/V elements. Examples of III-V compound semiconductors that can be used in the present embodiments include, but are not limited to alloys of gallium arsenide, indium arsenide, indium antimonide, indium phosphide, aluminum arsenide, indium gallium arsenide, indium aluminum arsenide, indium aluminum arsenide antimonde, indium aluminum arsenide phosphorude, indium gallium arsenide phosphorude and combinations thereof. In an embodiment, the bottom source drain regions 106 are made from doped III-V semiconductor materials with dopant concentrations ranging from approximately $1 \times 10^{18}$ to approximately $1 \times 10^{20}$ atoms/cm2, with a dopant concentration ranging from approximately $5 \times 10^{18}$ to approximately $8 \times 10^{19}$ atoms/cm2 being more typical.

The STI regions 108 penetrate, or extend below, the bottom source drain regions 106 and extend partially into the substrate 102. As illustrated, trenches are formed by any appropriate technique, for example an anisotropic etch or machining. Next, the trenches are filled with a dielectric material to form the STI regions 108. The STI regions 108 may be formed from any appropriate dielectric including, for example, silicon oxide ($SiO_x$) or silicon nitride ($Si_xN_y$).

Figure 2:
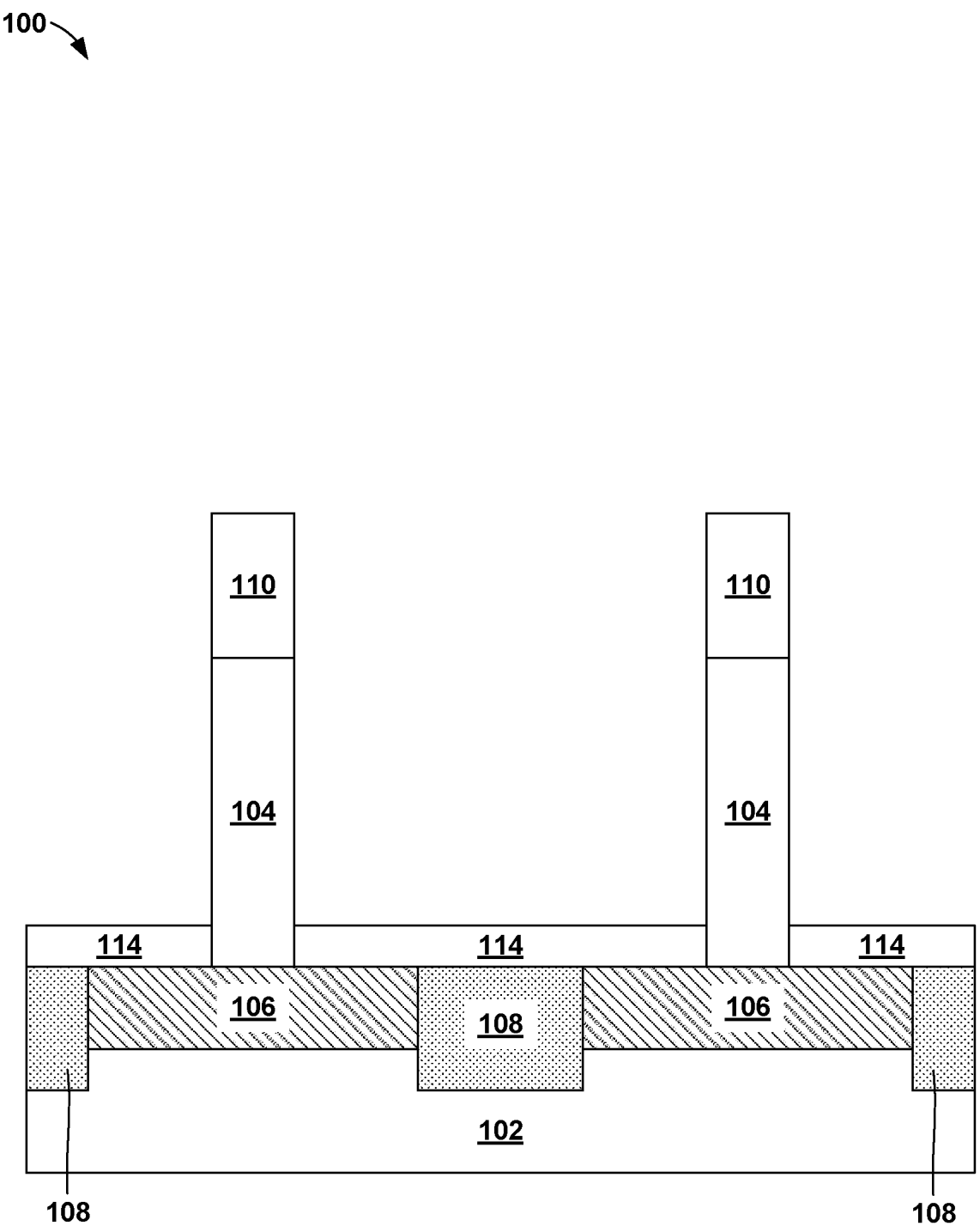
FIG. 2 is a cross-sectional view of the semiconductor structure after forming bottom spacers according to an exemplary embodiment.

Referring now to FIG. 2, the structure 100 is shown after forming bottom spacers 114 in accordance with an embodiment of the present invention. As is shown, the bottom spacers 114 contact sidewall surfaces of a lower portion of the at least one semiconductor fin 104. The bottom spacers 114 have a height, or thickness, that is less than a height of each semiconductor fin 104. Stated differently, topmost surfaces of the bottom spacers 114 are vertically offset and located far beneath topmost surfaces of each mask 110, and beneath topmost surfaces of the semiconductor fins 104.

In the illustrated embodiment, the bottom spacers 114 are deposited on a top surface of the bottom source drain regions 106. It is specifically contemplated that the bottom spacers 114 are deposited in an anisotropic manner, without accumulation on the sidewalls of the semiconductor fins 104. This may be accomplished using, for example, gas cluster ion beam (GCIB) deposition, where the surface is bombarded by high-energy cluster ions. In alternative embodiments, other deposition techniques may be used to form the bottom spacers 114 only on the horizontal surfaces.

Alternatively, the bottom spacers 114 are formed by first depositing a blanket dielectric layer followed by a recess etch to remove a portion of the blanket dielectric layer. The recess etch removes a portion of the blanket dielectric layer until the bottom spacers 114 remains. In such cases, the chosen dielectric material is etched selective to the masks 110 and the semiconductor fins 104. In an example, when the blanket dielectric layer is silicon oxide ($SiO_x$) and the masks 110 are silicon nitride ($Si_xN_y$), a hydrofluoric acid or a buffered oxide etchant (i.e., a mixture of ammonium fluoride and hydrofluoric acid) may be used during the recess etch technique.

Suitable spacer materials from which the bottom spacers 114 are formed include, but are not limited to, oxides such as silicon oxide ($SiO_x$), nitrides such as silicon nitride ($Si_xN_y$), and/or low-κ materials such as carbon-doped oxide materials containing silicon (Si), carbon (C), oxygen (O), and hydrogen (H) (SiCOH) or siliconborocarbonitride (SiBCN). The term "low-κ" as used herein refers to a material having a relative dielectric constant κ which is lower than that of silicon dioxide.

Figure 3:
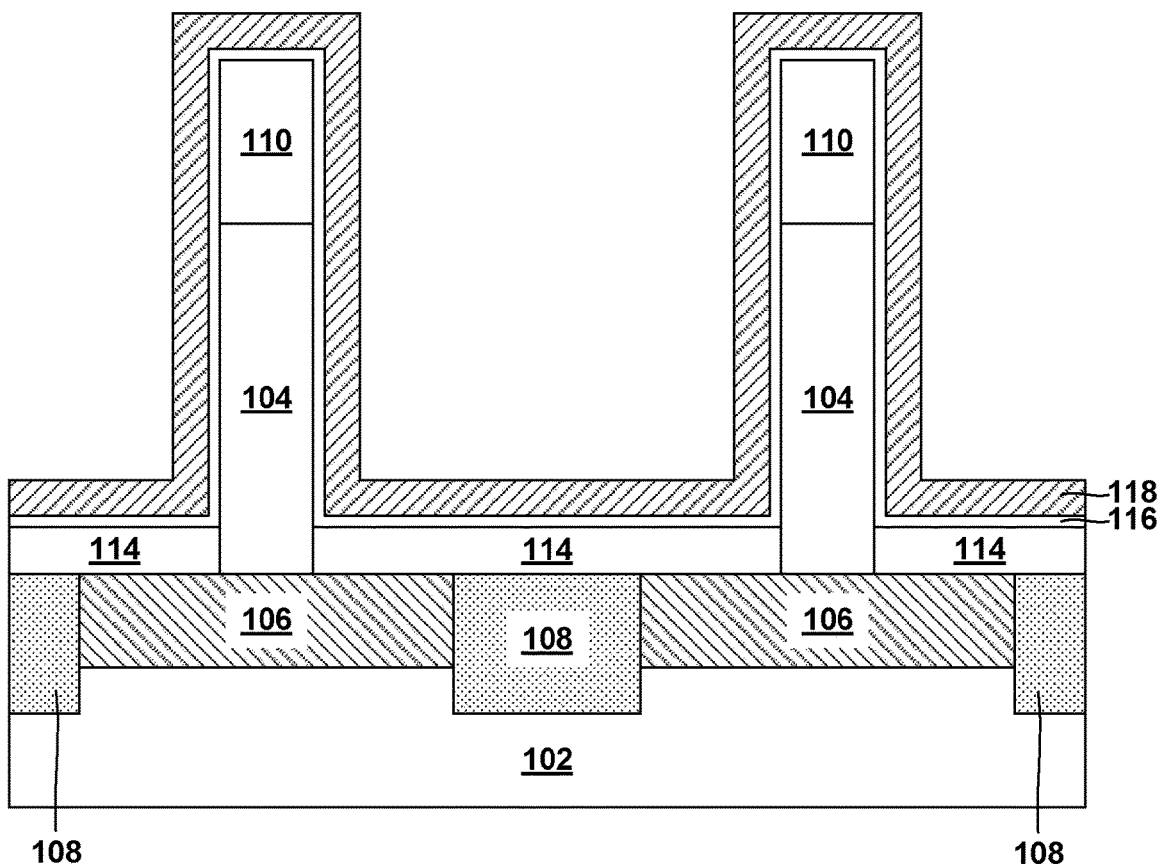
FIG. 3 is a cross-sectional view of the semiconductor structure after depositing a gate dielectric and a metal gate according to an exemplary embodiment.

Referring now to FIG. 3, the structure 100 is shown after depositing a gate dielectric 116 and a metal gate 118 in accordance with an embodiment of the present invention. In doing so, the gate dielectric 116 is conformally deposited directly on exposed surfaces of the semiconductor fins 104, or channel, and the bottom spacers 114. By "conformal" it is meant that a material layer has a continuous thickness. For example, a continuous thickness generally means a first thickness as measured from a bottom surface to a topmost surface that is the same as a second thickness as measured from an inner sidewall surface to an outer sidewall surface. In another embodiment, the gate dielectric 116 may be a non-conformal layer.

The gate dielectric 116 is composed of a gate dielectric material. The gate dielectric 116 can be an oxide, nitride, and/or oxynitride. In an example, the gate dielectric 116 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure including different gate dielectric materials, e.g., silicon dioxide, and a high-k gate dielectric can be formed and used as the gate dielectric 116.

The gate dielectric 116 can be formed by any deposition technique including, for example, chemical vapor deposition (CVD), plasma enhanced chemical vapor deposition (PECVD), physical vapor deposition (PVD), sputtering, or atomic layer deposition. In an embodiment, the gate dielectric 116 can have a thickness in ranging from approximately 1 nm to approximately 10 nm. Other thicknesses that are lesser than, or greater than, the aforementioned thickness range can also be employed for the gate dielectric 116.

In an embodiment, the metal gate 118 is composed of an n-type work function metal. As used herein, an "n-type work function metal" is a metal that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In an embodiment, the work function of the n-type work function metal ranges from 4.1 eV to 4.3 eV. In an embodiment, the n-type work function metal is composed of at least one of TiAl, TaN, TiN, HfN, HfSi, or combinations thereof. The n-type work function metal can be formed using chemical vapor deposition atomic layer deposition, sputtering or plating.

In another embodiment, the metal gate 118 may be a p-type work function metal. As used herein, a "p-type work function metal" is a metal that effectuates a p-type threshold voltage shift. In an embodiment, the work function of the p-type work function metal ranges from 4.9 eV to 5.2 eV. As used herein, "threshold voltage" is the lowest attainable gate voltage that will turn on a semiconductor device, for example, transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In an embodiment, the p-type work function metal may be composed of titanium, titanium nitride or titanium carbide. The p-type work function metal may also be composed of TiAlN, Ru, Pt, Mo, Co and alloys and combinations thereof. In an embodiment, the p-type work function metal can be formed by, a physical vapor deposition method, such as sputtering, chemical vapor deposition or atomic layer deposition.

The metal gate 118 can be formed by any deposition technique including, for example, chemical vapor deposition (CVD), plasma enhanced chemical vapor deposition (PECVD), physical vapor deposition (PVD), sputtering, or atomic layer deposition. Like the gate dielectric 116, the metal gate 118 is conformally deposited directly on exposed surfaces of the gate dielectric 116. In doing so, the metal gate 118 is disposed around each semiconductor fin 104.

In an embodiment, the metal gate 118 can have a thickness in a ranging from approximately 1 nm to approximately 10 nm. Other thicknesses that are lesser than, or greater than, the aforementioned thickness range can also be employed for the used in providing the metal gate 118. It is critical to monitor and control forming of the metal gate 118 to prevent pinch off between adjacent devices, especially, in narrow-pitch configurations. As illustrated, the bottom spacers 114 separate the bottom source drain regions 106 from the metal gate 118.

Figure 4:
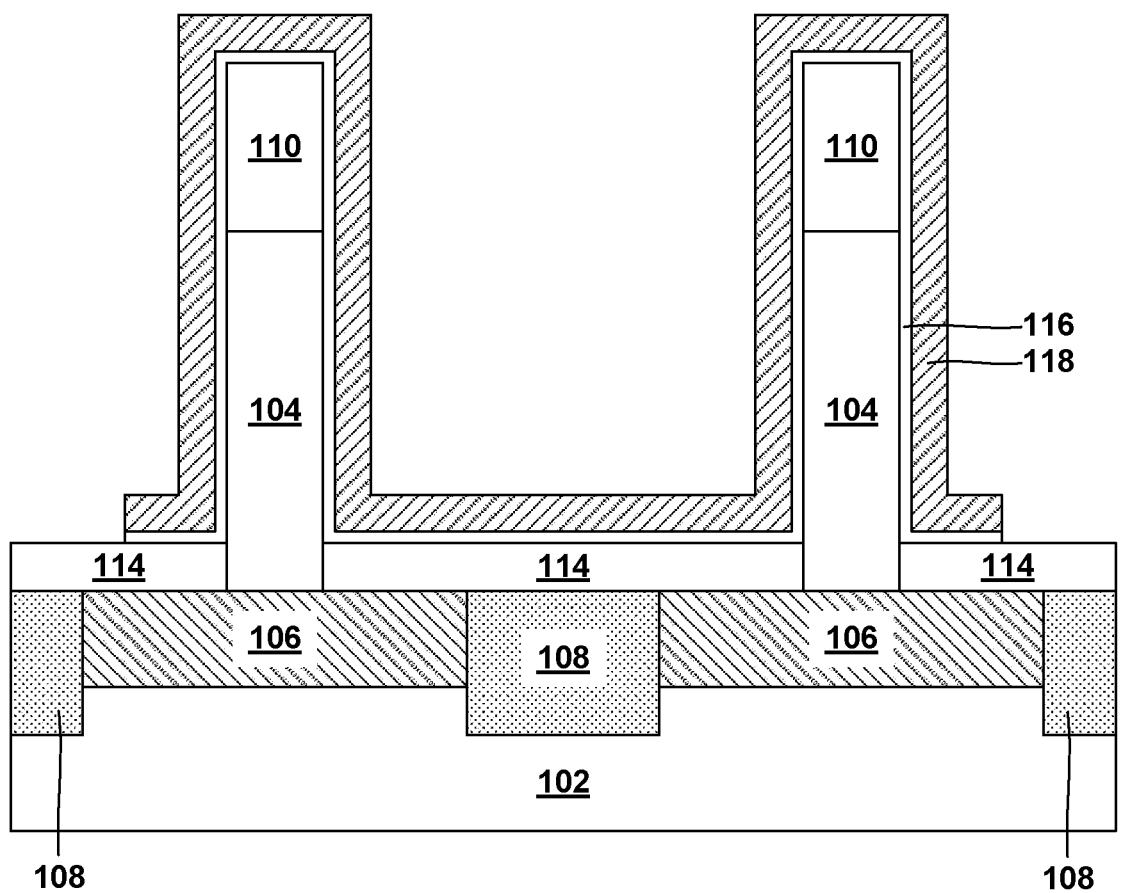
FIG. 4 is a cross-sectional view of a semiconductor structure after patterning the gate dielectric and the metal gate according to an exemplary embodiment.

Referring now to FIG. 4, the structure 100 is shown after patterning the gate dielectric 116 and the metal gate 118 in accordance with an embodiment of the present invention. Both the gate dielectric 116 and the metal gate 118 are patterned or etched using known lithographic techniques such as a wet etch, a dry etch, or a combination of sequential wet and/or dry etches. For example, an anisotropic etch, such as, reactive ion etching may be used to remove material that is not covered by a mask defining the gate regions of the structure 100.

Figure 5:
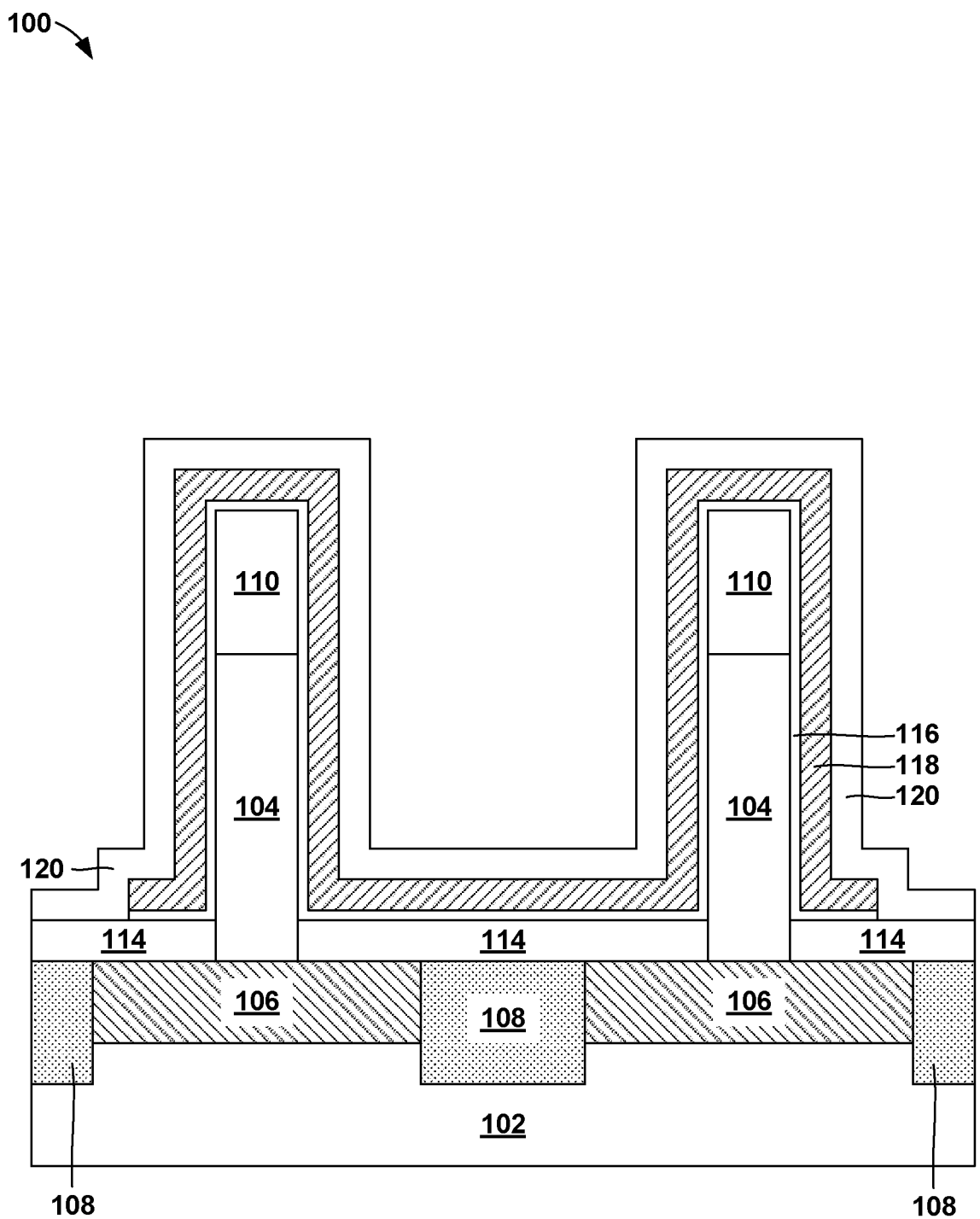
FIG. 5 is a cross-sectional view of a semiconductor structure after forming an encapsulation layer according to an exemplary embodiment.

Referring now to FIG. 5, the structure 100 is shown after forming an encapsulation layer 120 in accordance with an embodiment of the present invention. In doing so, the encapsulation layer 120 is conformally deposited directly on exposed surfaces of the metal gate 118 and portions of the bottom spacers 114. Most importantly, the encapsulation layer 120 completely covers the metal gate 118. The encapsulation layer 120 serves as a protective layer and is composed amorphous silicon. The encapsulation layer 120 is specifically designed to oxidize and thus prevent oxygen from reaching and damaging the metal gate 118. As illustrated, the encapsulation layer 120 layer directly contacts an edge of a gate dielectric 116.

The encapsulation layer 120 can be formed by any suitable deposition technique including, for example, chemical vapor deposition (CVD), plasma enhanced chemical vapor deposition (PECVD), physical vapor deposition (PVD), sputtering, or atomic layer deposition. In general, the encapsulation layer 120 should be thick enough to provide to allow for sufficient oxidation by a subsequently formed dielectric material, but thin enough to maintain necessary space between adjacent devices. In an embodiment, the encapsulation layer 120 can have a thickness in ranging from approximately 1 nm to approximately 10 nm. Other thicknesses that are lesser than, or greater than, the aforementioned thickness range can also be employed for the encapsulation layer 120.

Figure 6:
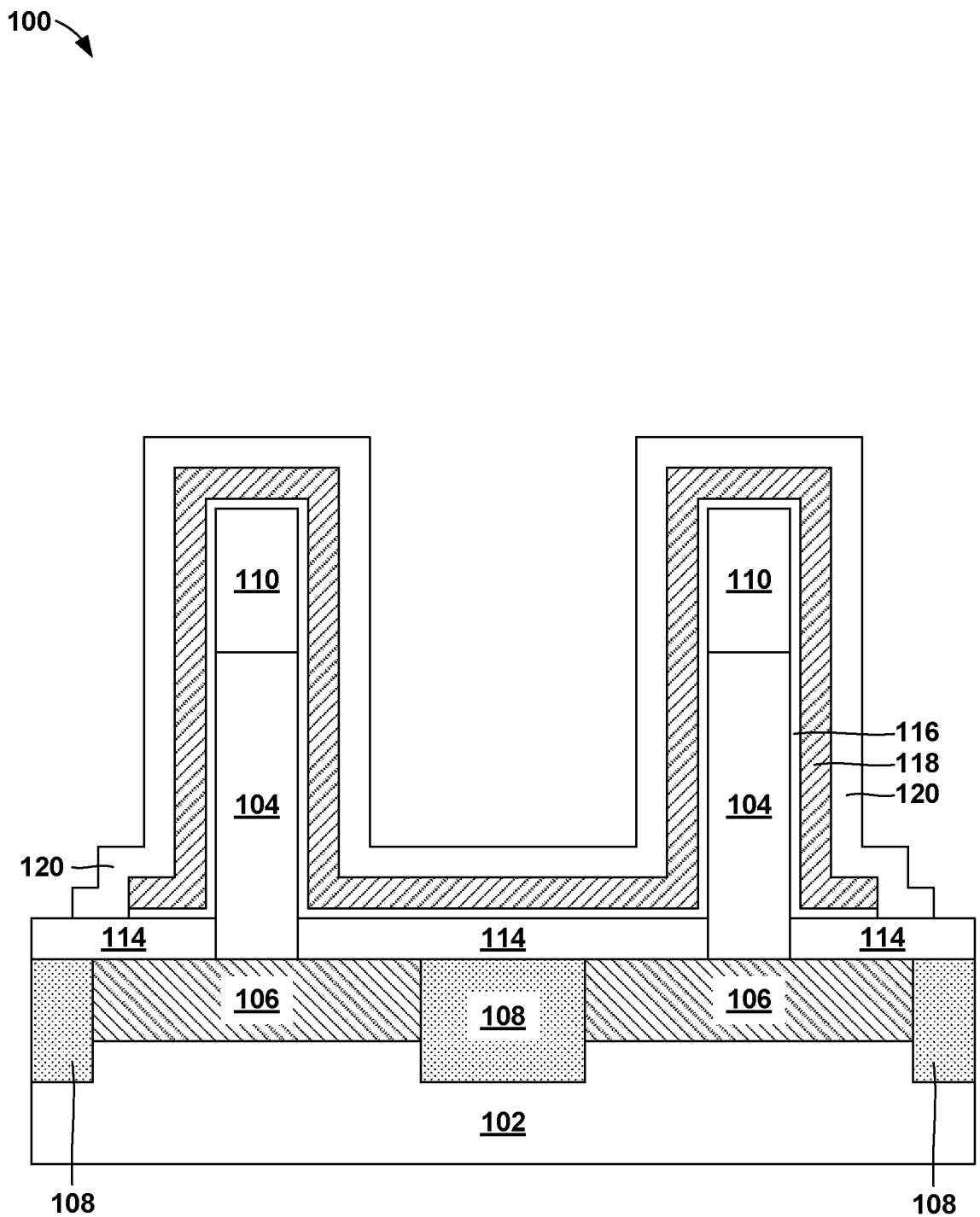
FIG. 6 is a cross-sectional view of a semiconductor structure after removing portions of the encapsulation layer according to an exemplary embodiment.

Referring now to FIG. 6, the structure 100 is shown after removing portions of the encapsulation layer 120 in accordance with an embodiment of the present invention. More specifically, the encapsulation layer 120 is trimmed, etched, or recessed to expose top portions of the bottom spacers 114. The encapsulation layer 120 is recessed or etched selective to the bottom spacers 114. The encapsulation layer 120 is patterned or etched using known lithographic techniques such as a wet etch, a dry etch, or a combination of sequential wet and/or dry etches. For example, an anisotropic etch, such as, reactive ion etching may be used to remove material that is not covered by a mask defining the gate regions of the structure 100. Etching or trimming of the encapsulation layer 120 is important to avoid potential gate shorts between adjacent devices.

Figure 7:
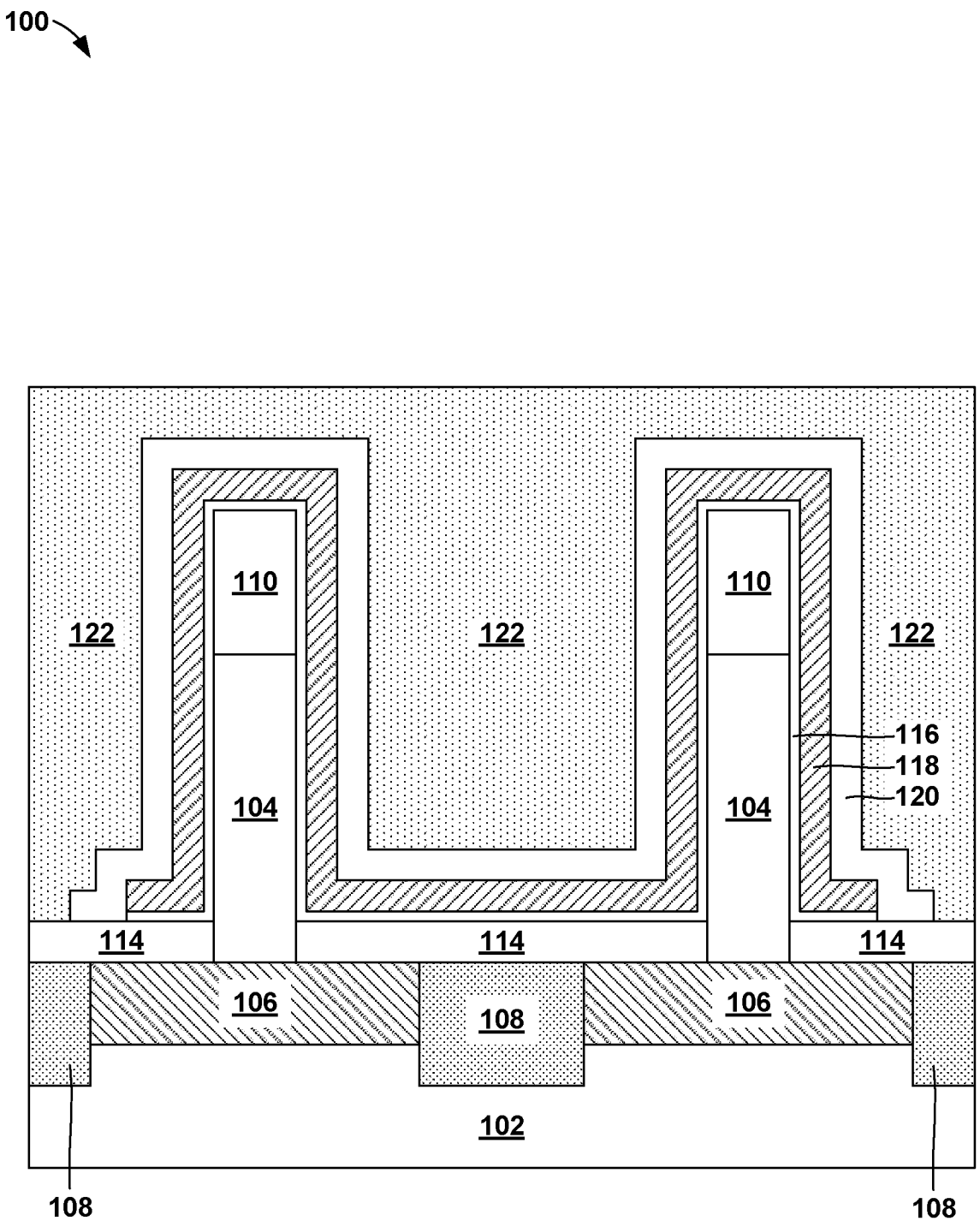
FIG. 7 is a cross-sectional view of a semiconductor structure after forming an interlevel dielectric layer according to an exemplary embodiment.

Referring now to FIG. 7, the structure 100 is shown after forming an interlevel dielectric layer 122 in accordance with an embodiment of the present invention. In doing so, the interlevel dielectric layer 122 surrounds the structure shown in FIG. 7.

The interlevel dielectric layer 122 may be composed of, for example, silicon oxide ($SiO_x$), undoped silicate glass (USG), fluorosilicate glass (FSG), borophosphosilicate glass (BPSG), a spin-on low-κ dielectric layer, a chemical vapor deposition (CVD) low-κ dielectric layer or any combination thereof. As indicated above, the term "low-κ" as used herein refers to a material having a relative dielectric constant κ which is lower than that of silicon dioxide.

In an embodiment, the interlevel dielectric layer 122 can be formed using a deposition technique including, for example, chemical vapor deposition (CVD), plasma enhanced chemical vapor deposition (PECVD), physical vapor deposition (PVD), atomic layer deposition (ALD), evaporation, spin-on coating, or sputtering.

After deposition, a planarization technique such as, for example, chemical mechanical planarization (CMP) and/or grinding is applied. The planarization technique removes excess material of the interlevel dielectric layer 122 and continues polishing until the uppermost surfaces of the encapsulation layer 120 are exposed. After polishing the uppermost surfaces of the encapsulation layer 120 are flush, or substantially flush, with an uppermost surface of the interlevel dielectric layer 122. In another embodiment, interlevel dielectric layer 122 may include a self-planarizing material such as a spin-on glass (SOG) or a spin-on low-κ dielectric material such as SiLK™. Doing so may avoid the need to perform a subsequent planarizing step.

Figure 8:
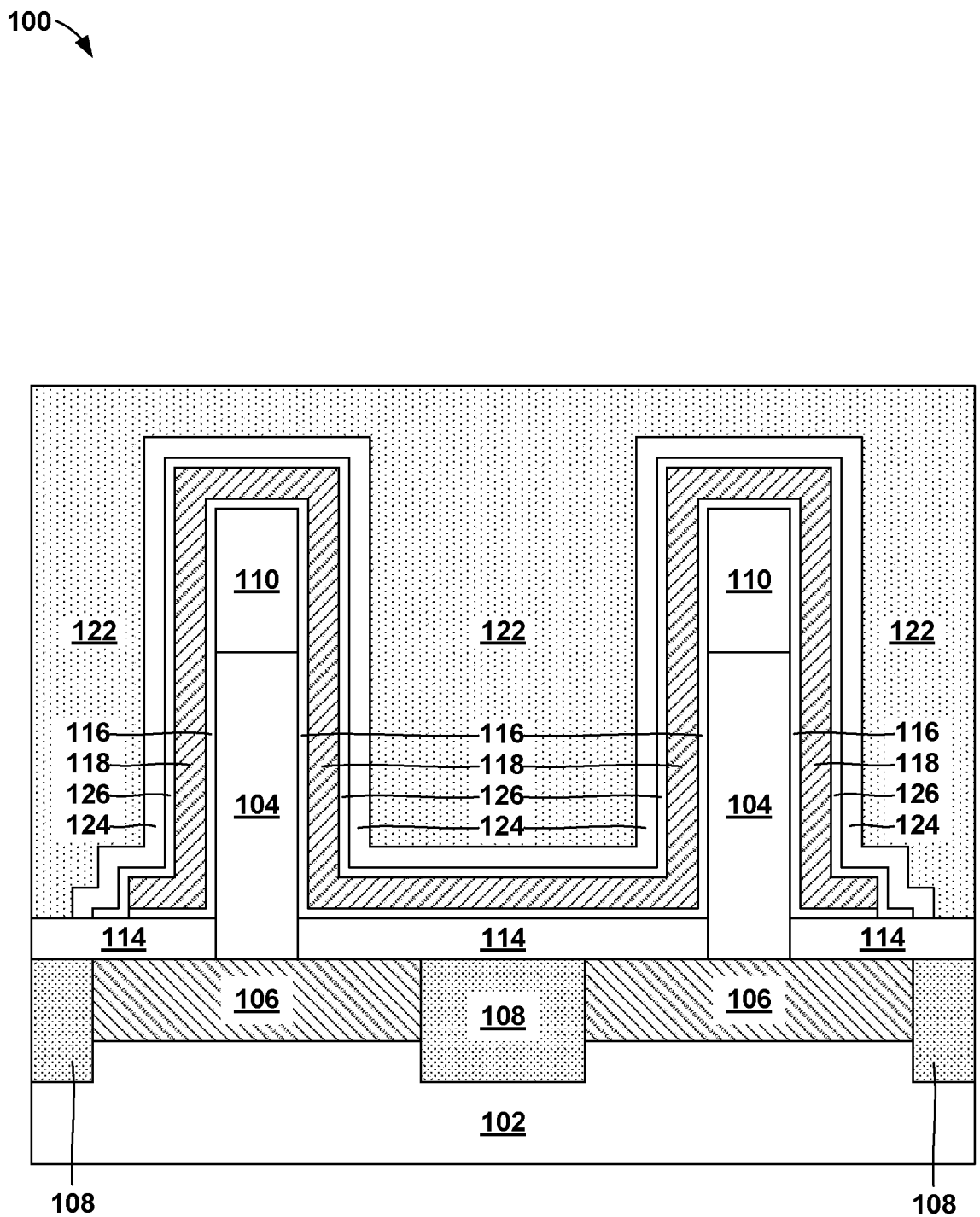
FIG. 8 is a cross-sectional view of a semiconductor structure after forming an oxidation layer and remaining portion of the encapsulation layer according to an exemplary embodiment.

Referring now to FIG. 8, the structure 100 is shown after an oxidation layer 124 is formed and a portion of the encapsulation layer 126 remains in accordance with an embodiment of the present invention. More specifically, deposition of the interlevel dielectric layer 122 causes a portion of the encapsulation layer 120 to oxidize. Downstream processing, for example deposition of the interlevel dielectric layer 122, inevitably contains some amount of oxygen which can undesirably affect the threshold voltage if it comes in contact with the gate stack, including the metal gate 118 and the gate dielectric 116. It is a primary object of the present invention to prevent oxygen from contacting the gate stack. The encapsulation layer 120 is used to block the oxygen from reaching gate stack because the encapsulation layer 120, for example amorphous silicon, will oxidize first.

The amount or thickness of the encapsulation layer 120 that oxidizes is dependent on its starting thickness. In some embodiments, the encapsulation layer 120 might oxidize its entire thickness; however, such cases would be undesirable and indicate a possibility of oxygen reaching the gate stack. It is therefore desirable to witness or detect the remaining portion of the encapsulation layer 126. Evidence of the remaining portion of the encapsulation layer 126 indicates the encapsulation layer 120 is working to prevent oxygen from reaching the gate stack.

It is noted that oxidation of the encapsulation layer 120 will begin during formation of interlevel dielectric layer 122; however, is shown and described separately for illustrative purposes only.

Figure 9:
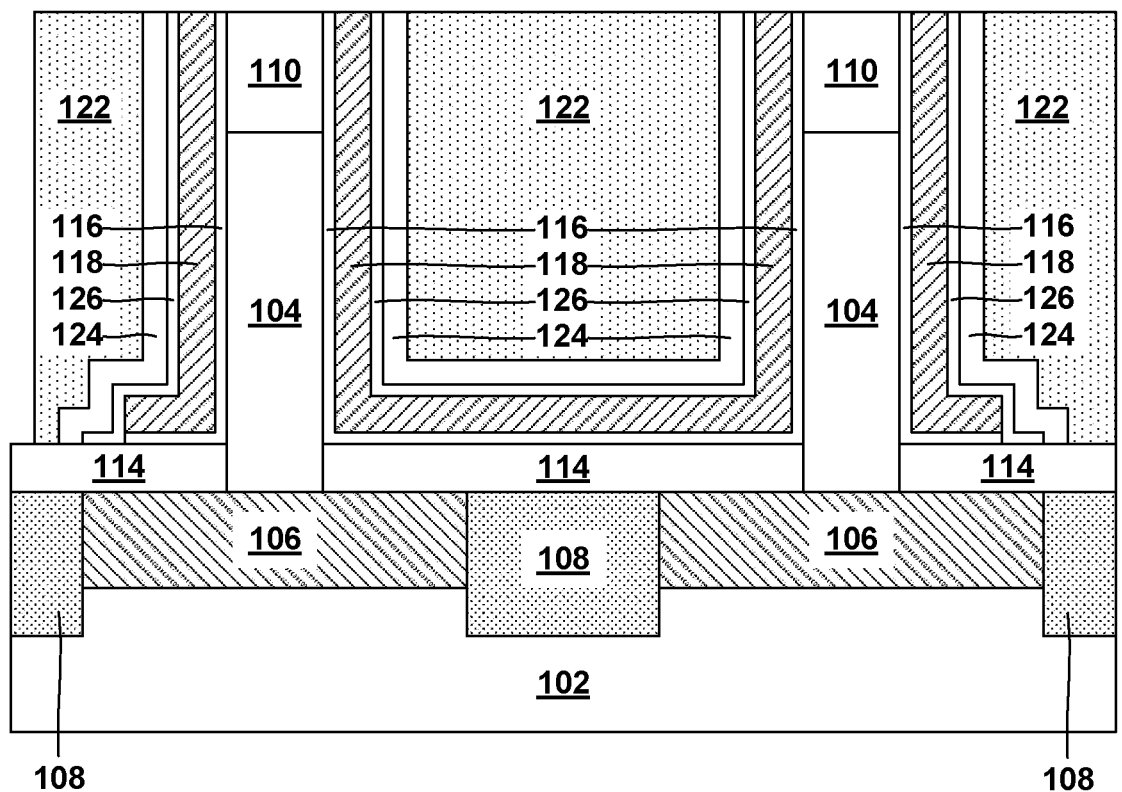
FIG. 9 is a cross-sectional view of a semiconductor structure after polishing to expose the masks according to an exemplary embodiment.

Referring now to FIG. 9, the structure 100 is shown after polishing to expose the masks 110 in accordance with an embodiment of the present invention.

After forming the interlevel dielectric layer 122 and forming the oxidation layer 124 from a portion of the encapsulation layer 120, a planarization technique such as, for example, chemical mechanical planarization (CMP) and/or grinding is applied. The planarization technique removes excess material of the interlevel dielectric layer 122, the oxidation layer 124, the remaining portion of the encapsulation layer 126, the metal gate 118, and the gate dielectric 116. Polishing continues until the uppermost surfaces of the masks 110 are exposed. After polishing the uppermost surfaces of the interlevel dielectric layer 122, the oxidation layer 124, the remaining portion of the encapsulation layer 126, the metal gate 118, and the gate dielectric 116 are flush, or substantially flush with one another.

Figure 10:
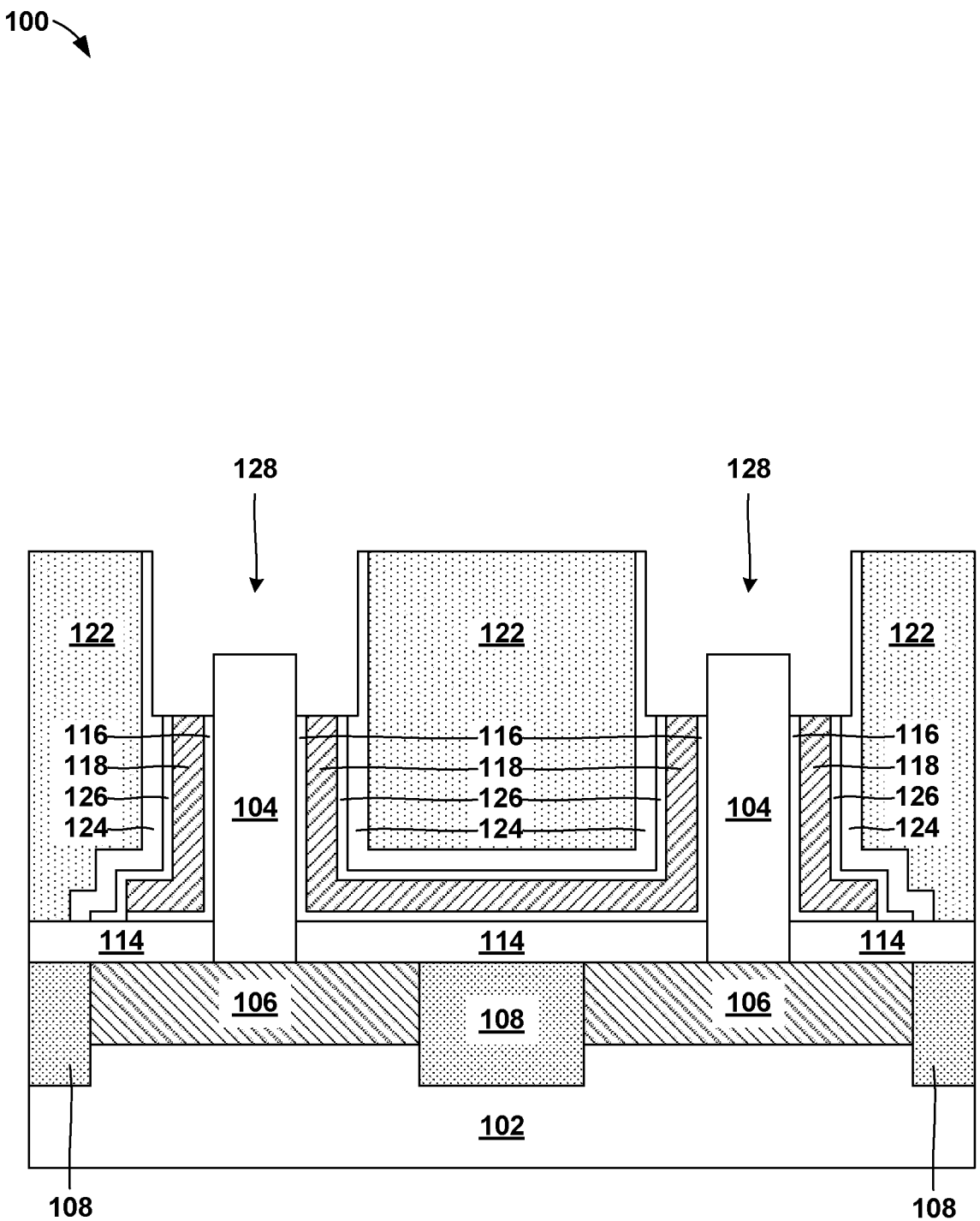
FIG. 10 is a cross-sectional view of a semiconductor structure after recessing the masks, the oxidation layer, the remaining portion of the encapsulation layer, the metal gate, and the gate dielectric according to an exemplary embodiment.

Referring now to FIG. 10, the structure 100 is shown after recessing the masks 110, the oxidation layer 124, the remaining portion of the encapsulation layer 126, the metal gate 118, and the gate dielectric 116 in accordance with an embodiment of the present invention. More specifically, the oxidation layer 124, the remaining portion of the encapsulation layer 126, the metal gate 118, and the gate dielectric 116 are recessed to expose top portions of the semiconductor fins 104, and remove the masks 110.

The metal gate 118 and the gate dielectric 116 can be recessed using any suitable method, such as a wet etch, a dry etch, or a combination of sequential wet and/or dry etches. In an embodiment, the metal gate 118 and the gate dielectric 116 could be recessed using an anisotropic etch such as, for example, reactive ion etching. Alternatively, a wet etching technique may be used to recess the metal gate 118 and the gate dielectric 116.

Etching will create an opening 128, or space, between the semiconductor fins 104 and the oxidation layer 124, as illustrated. After etching, uppermost surfaces of the encapsulation layer 126, the metal gate 118, and the gate dielectric 116 will be below an upper surface of the semiconductor fins 104. Additionally, not all of the oxidation layer 124 is removed and a portion remains along sidewalls of the opening 128.

It is critical that the metal gate 118 and the gate dielectric 116 are recessed below an upper surface of the semiconductor fins 104 to ensure proper isolation between gate metal and the top source drain (See FIG. 12). If the metal gate 118 and the gate dielectric 116 are not recessed below the top surface of the semiconductor fins 104, a later formed source drain epitaxy may contact the metal gate 118 and create a short. As such, controlling the recess depth of the metal gate 118 and the gate dielectric 116, specifically, below the tops of the semiconductor fins 104 will allow for accurate top junction definition as well as define the channel length.

Figure 11:
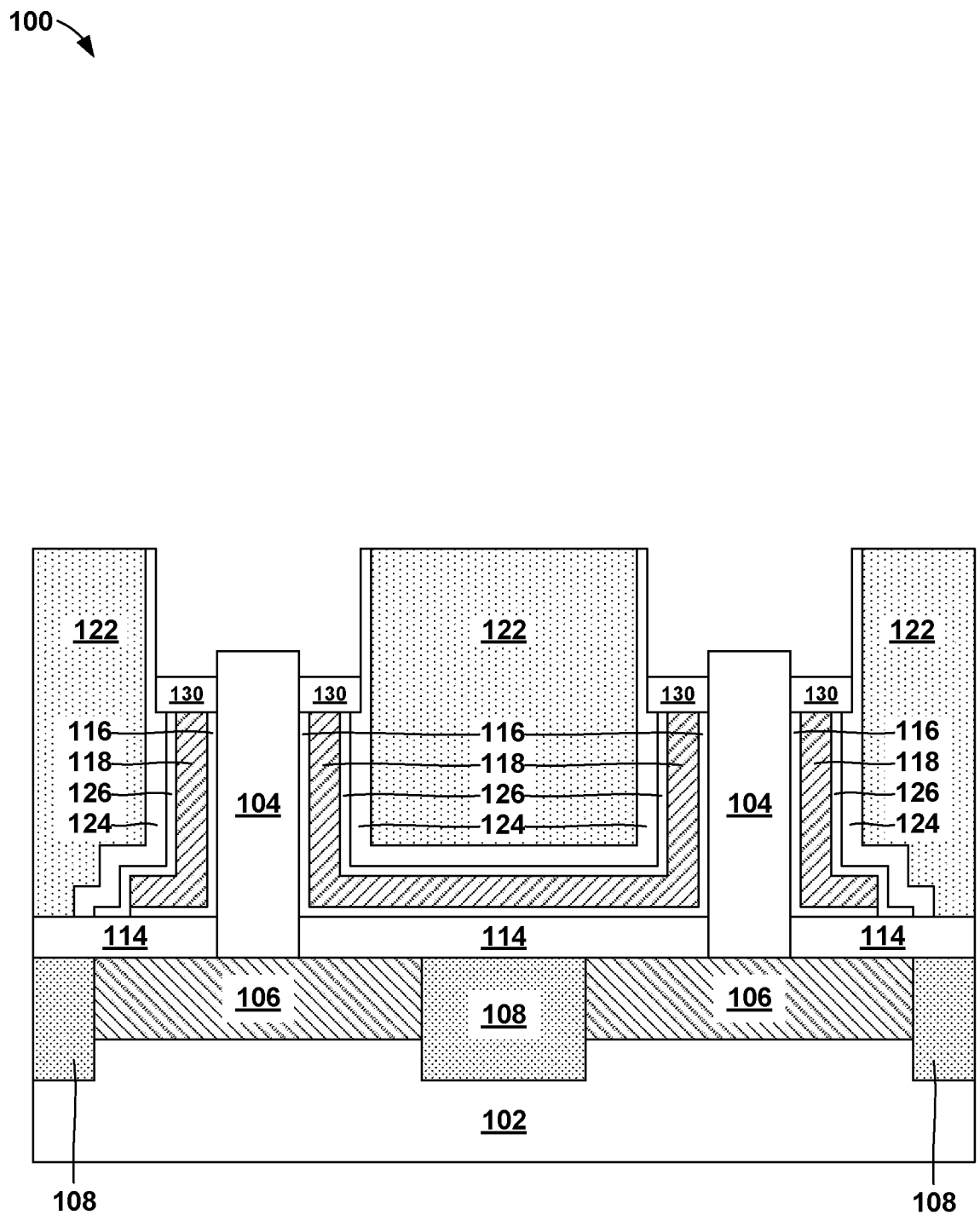
FIG. 11 is a cross-sectional view of a semiconductor structure after forming top spacers according to an exemplary embodiment.

Referring now to FIG. 11, the structure 100 is shown after forming top spacers 130 in accordance with an embodiment of the present invention. More specifically, the top spacers 130 may be formed directly on top of upper surfaces of the metal gate 118 and the gate dielectric 116 exposed by the prior recessing.

The top spacers 130 may be formed using a deposition technique followed by a spacer etch (anisotropic etch). For example, techniques for depositing the top spacers 130 include, for example, chemical vapor deposition (CVD), plasma enhanced chemical vapor deposition (PECVD), physical vapor deposition (PVD), atomic layer deposition (ALD), evaporation, spin-on coating, or sputtering. For example, techniques for etching the top spacers 130 include dry etching techniques, such as, for example, reactive ion etching, ion beam etching, plasma etching or laser ablation. The top spacers 130 are composed of any dielectric material that is similar, in terms of composition and etch rate, to the bottom spacers 114 described above.

Figure 12:
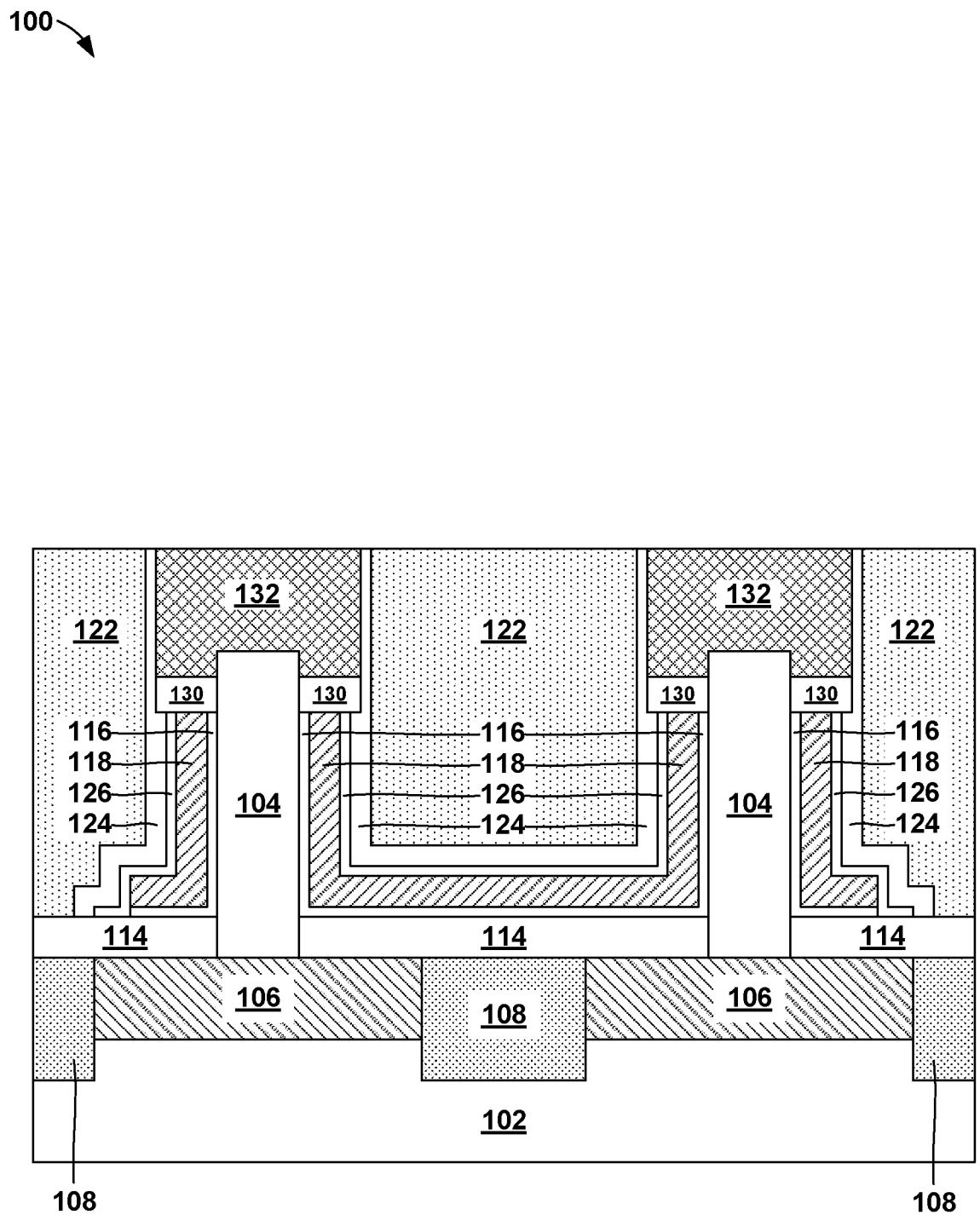
FIG. 12 is a cross-sectional view of a semiconductor structure after forming top source drain regions according to an exemplary embodiment.

Referring now to FIG. 12, the structure 100 is shown after forming top source drain regions 132 in accordance with an embodiment of the present invention. The top source drain regions 132 are formed directly on the top spacers 130, within the opening 128. As such, the top source drain regions 132 directly contact exposed top surfaces and sidewall portions of the semiconductor fins 104. The top spacers 130 separate and isolate the top source drain regions 132 from the metal gate 118. A remaining portion of the oxidation layer separates the top source drain regions 132 from the interlevel dielectric layer 122. Of note, a bottom surface of each top source drain region 132 is below a top surface of each semiconductor fin 104.

The top source drain regions 132 can be epitaxially grown from exposed sidewalls of the semiconductor fins 104 using conventional techniques similar to the bottom source drain regions 106. Additionally, the top source drain regions 132 can be formed from similar materials and similar dopant concentrations as bottom source drain regions 106. In the present embodiment, the top source drain regions 132 should be grown to completely fill the opening 128.

Figure 13:
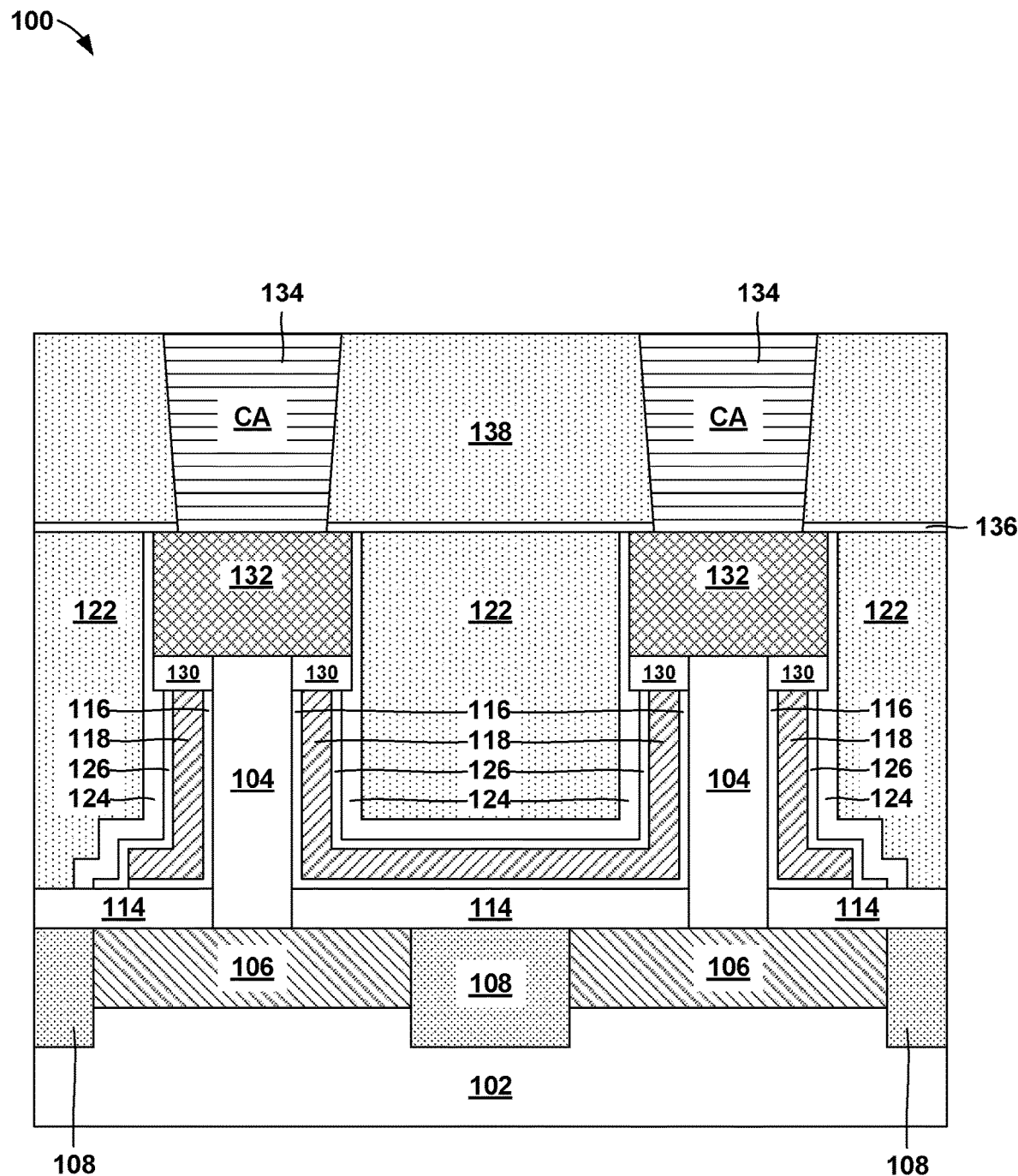
FIG. 13 is a cross-sectional view of a semiconductor structure after forming contact structures according to an exemplary embodiment.

Referring now to FIG. 13, the structure 100 is shown after forming contact structures 134 in accordance with an embodiment of the present invention. First, an etch stop layer 136 is deposited on top of the structure 100 followed by another interlevel dielectric layer 138. Next, contact trenches are formed in the interlevel dielectric layer 138 and the etch stop layer 136, which expose upper surfaces of the top source drain regions 132. Finally, the contact trenches are filled with a conductive material to form the contact structures 134. The contact structures 134 can be formed by depositing a conductive material in the contact trench. As such, in at least on embodiment, the conductive material of the contact structures 134 is deposited directly on exposed upper surfaces of the oxidation layer 124 and the top source drain regions 132.

The contact structures 134 may include any suitable conductive material, such as, for example, copper, aluminum, tungsten, cobalt, or alloys thereof. Examples of deposition techniques that can be used in providing the spacer material include, for example, chemical vapor deposition (CVD), plasma enhanced chemical vapor deposition (PECVD), or atomic layer deposition (ALD). In some cases, an electroplating technique can be used to form the contact structures 134.

After deposition, a planarization technique such as, for example, chemical mechanical planarization (CMP) and/or grinding is applied. The planarization technique removes excess conductive material of the contact structures 134 from above the additional interlevel dielectric layer 138. After polishing, upper surfaces of the contact structures 134 are flush, or substantially flush, with upper surface of the additional interlevel dielectric layer 138.

As illustrated in FIG. 13, the vertical transistor device represented by the structure 100 in this example has some distinctive notable features. For instance, the structure 100 includes a silicon nitride free encapsulation layer, otherwise the oxidation layer 124. More specifically, the metal gate 118 and gate dielectric 116 are protected by both the oxidation layer 124 and the remaining portion of the encapsulation layer 126. As previously mentioned, the oxidation layer 124 is particularly beneficial because it minimizes unwanted shifts in threshold voltage and increase device reliability.

Figure 14:
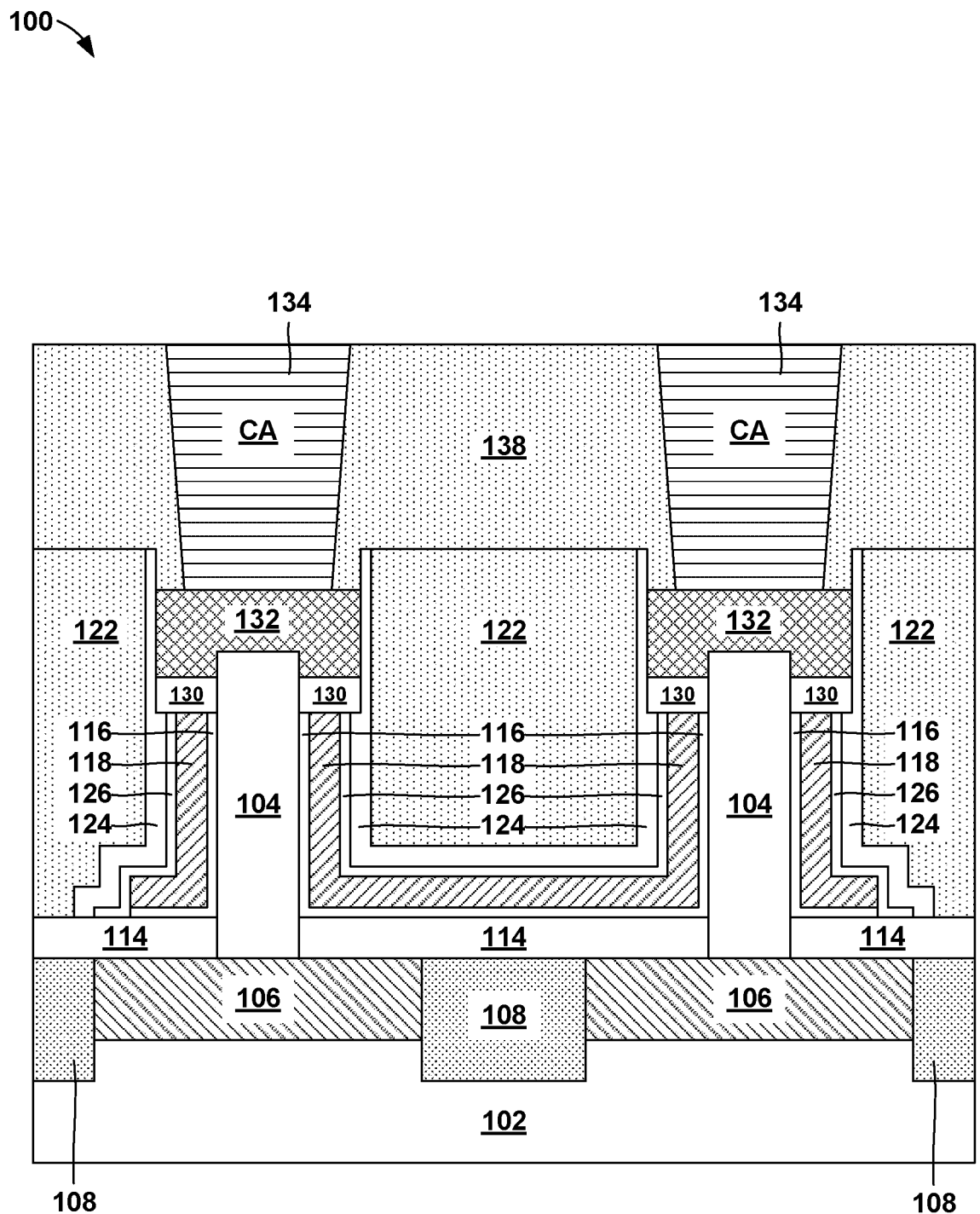
FIG. 14 is a cross-sectional view of a semiconductor structure according to an alternative embodiment.

Referring now to FIG. 14, in an alternative embodiment, the top source drain regions 132 may be recessed after formation, thereby decreasing its thickness.

Figure 15:
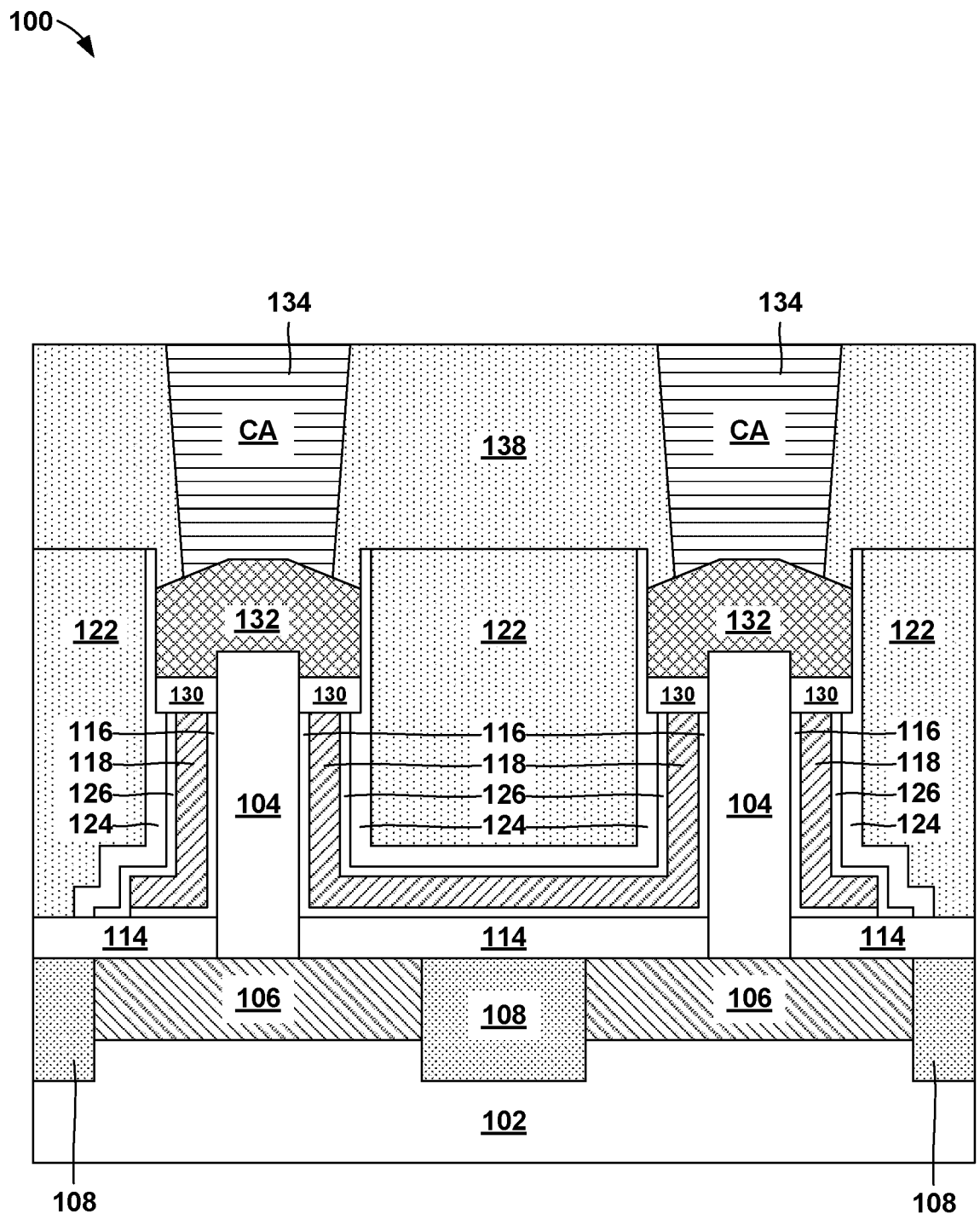
FIG. 15 is a cross-sectional view of a semiconductor structure according to an alternative embodiment.

Referring now to FIG. 15, in yet another embodiment, the top source drain regions 132 can be grown such that the top of the second top epitaxy 144 may have faceted surfaces allowing for increase contact area with a subsequently formed contact structure.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
   a bottom source drain region arranged on a substrate;
   a semiconductor channel region extending vertically upwards from a top surface of the bottom source drain region;
   a metal gate disposed around the semiconductor channel region;
   a top source drain region above the semiconductor channel region;
   an amorphous silicon layer directly on top of the metal gate; and
   an oxidation layer directly on top of the amorphous silicon layer, wherein the amorphous silicon layer and the oxidation layer together completely separate the metal gate from a surrounding interlevel dielectric layer.

2. The semiconductor structure according to claim 1, further comprising:
   a bottom spacer separating the bottom source drain region from the metal gate.

3. The semiconductor structure according to claim 1, further comprising:
   a dielectric spacer separating the metal gate from the top source drain region.

4. The semiconductor structure according to claim 1, wherein the oxidation layer separates an entire sidewall of the top source drain region from the surrounding interlevel dielectric layer.

5. The semiconductor structure according to claim 1, wherein the oxidation layer separates a dielectric spacer from the surrounding interlevel dielectric layer, the dielectric spacer separating the metal gate from the top source drain region.

6. The semiconductor structure according to claim 1, wherein a portion of the amorphous silicon layer and a portion of the oxidation layer directly contact an uppermost surface of a bottom spacer.

7. The semiconductor structure according to claim 1, wherein the amorphous silicon layer directly contacts an edge of a gate dielectric layer.

8. The semiconductor structure according to claim 1, wherein an uppermost surface of the amorphous silicon layer is below an uppermost surface of the oxidation layer.

9. The semiconductor structure according to claim 1, wherein the oxidation layer is thicker than the amorphous silicon layer.

10. The semiconductor structure according to claim 1, wherein an uppermost surface of the oxidation layer is substantially flush with an uppermost surface of the top source drain region, and another upper surface of the oxidation layer is substantially flush with an uppermost surface of the metal gate.

11. A semiconductor structure comprising:
a bottom source drain region arranged on a substrate;
a semiconductor channel region extending vertically upwards from a top surface of the bottom source drain region;
a metal gate disposed around the semiconductor channel region;
a top source drain region above the semiconductor channel region;
an amorphous silicon layer directly on top of the metal gate; and
an oxidation layer directly on top of the amorphous silicon layer, wherein the amorphous silicon layer and the oxidation layer together completely separate the metal gate from a surrounding interlevel dielectric layer,
wherein an uppermost surface of the metal gate, an uppermost surface of the amorphous silicon layer, and an upper surface of the oxidation layer are substantially flush with one another, and another upper surface of the oxidation layer is substantially flush with an uppermost surface of the top source drain region.

12. The semiconductor structure according to claim 8, further comprising:
a dielectric spacer separating the metal gate from the top source drain region.

13. The semiconductor structure according to claim 8, wherein the oxidation layer separates an entire sidewall of the top source drain region from the surrounding interlevel dielectric layer.

14. The semiconductor structure according to claim 8, wherein the oxidation layer separates a dielectric spacer from the surrounding interlevel dielectric layer, the dielectric spacer separating the metal gate from the top source drain region.

15. The semiconductor structure according to claim 8, wherein a portion of the amorphous silicon layer and a portion of the oxidation layer directly contact an uppermost surface of a bottom spacer.

16. The semiconductor structure according to claim 8, wherein the amorphous silicon layer directly contacts an edge of a gate dielectric layer.

17. The semiconductor structure according to claim 8, wherein an uppermost surface of the amorphous silicon layer is below an uppermost surface of the oxidation layer.

18. The semiconductor structure according to claim 8, wherein the oxidation layer is thicker than the amorphous silicon layer.

19. The semiconductor structure according to claim 8, wherein an uppermost surface of the oxidation layer is substantially flush with an uppermost surface of the top source drain region, and another upper surface of the oxidation layer is substantially flush with an uppermost surface of the metal gate.

20. A method comprising:
forming a bottom source drain region arranged on a substrate;
forming a semiconductor channel region extending vertically upwards from a top surface of the bottom source drain region;
forming a metal gate disposed around the semiconductor channel region;
forming a top source drain region above the semiconductor channel region;
forming an amorphous silicon layer directly on top of the metal gate; and
forming an oxidation layer directly on top of the amorphous silicon layer, wherein the amorphous silicon layer and the oxidation layer together completely separate the metal gate from a surrounding interlevel dielectric layer.

* * * * *